United States Patent [19]

David

[11] Patent Number: 5,026,291
[45] Date of Patent: Jun. 25, 1991

[54] BOARD MOUNTED CONNECTOR SYSTEM

[75] Inventor: James J. David, Sturbridge, Mass.

[73] Assignee: E. I. Du Pont de Nemours and Company, Wilmington, Del.

[21] Appl. No.: 566,021

[22] Filed: Aug. 10, 1990

[51] Int. Cl.[5] .............................................. H01R 9/09
[52] U.S. Cl. ...................................... 439/67; 439/77; 439/493
[58] Field of Search ....................... 439/64, 67, 76, 77, 439/492, 493, 499

[56] References Cited

U.S. PATENT DOCUMENTS

| | | | |
|---|---|---|---|
| 3,319,216 | 5/1967 | McCullough | 439/67 |
| 3,614,707 | 10/1971 | Kaufman | 439/67 |
| 4,348,071 | 9/1982 | Hsieh | 439/67 |
| 4,798,541 | 1/1989 | Porter | 439/67 |
| 4,881,901 | 11/1989 | Mendenhall et al. | 439/67 |
| 4,907,975 | 3/1990 | Dranchak et al. | 439/67 |
| 4,911,644 | 3/1990 | Bond et al. | 439/67 |

Primary Examiner—Paula A. Bradley

[57] ABSTRACT

A board mounted connector system for interconnecting the planar pads disposed in an area array on a surface of a board includes (a) a modular connector, (b) a frame, and (c) securing means for securing the connector within a predetermined distance of the surface of the board. The frame may be mounted to either side of the board.

4 Claims, 6 Drawing Sheets

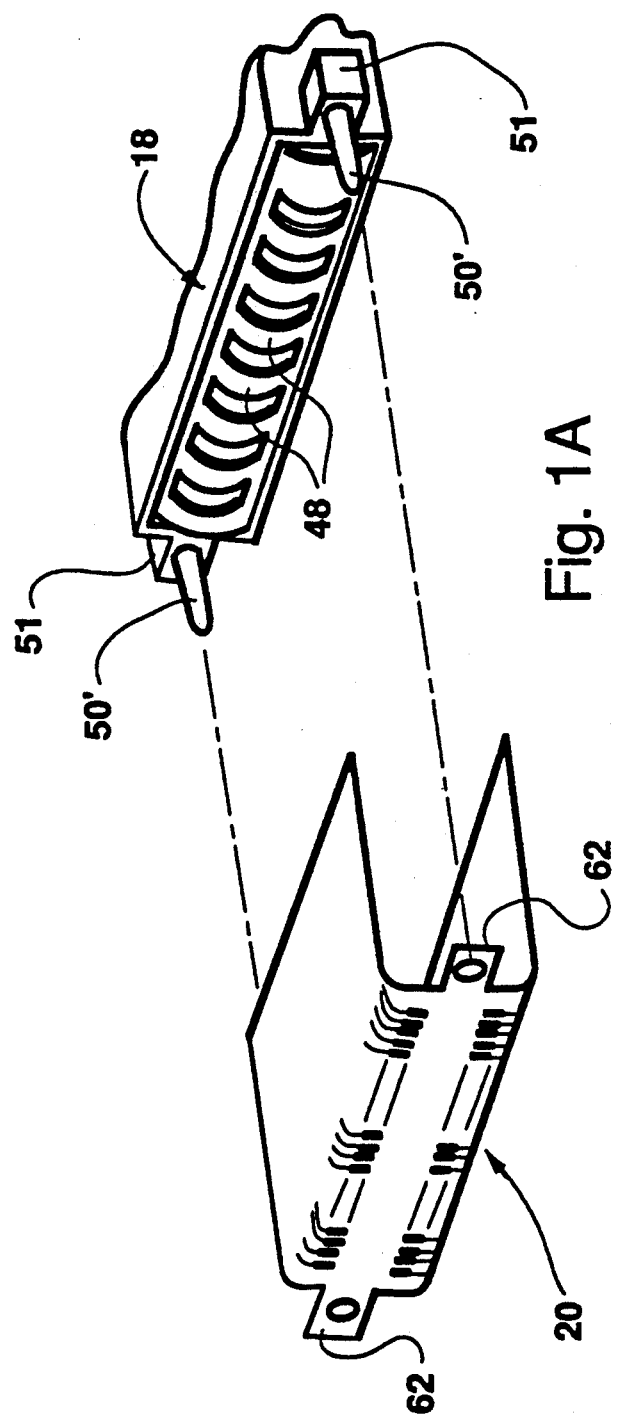

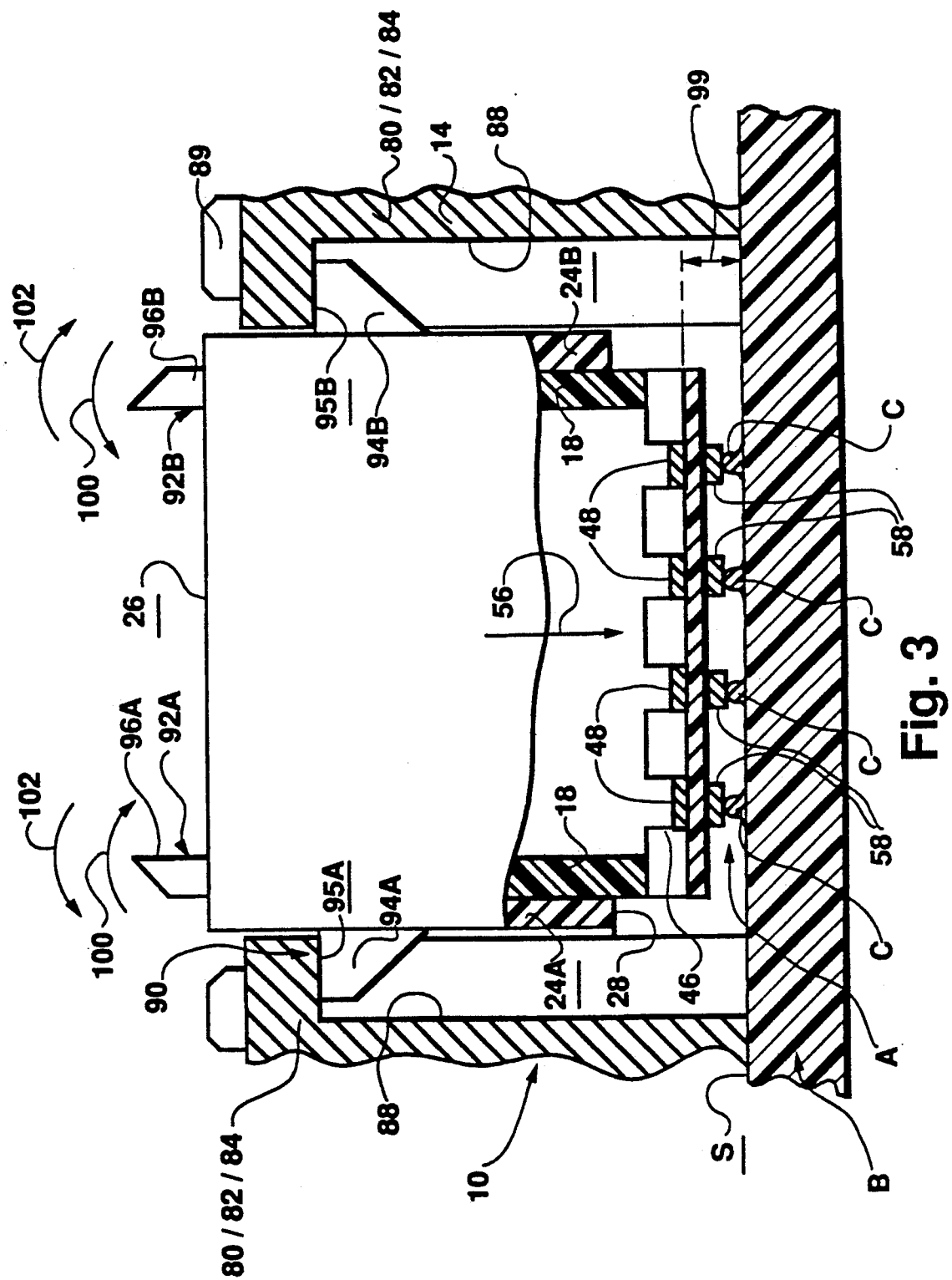

BOARD MOUNTED CONNECTOR SYSTEM

BACKGROUND OF THE INVENTION

1. Field of the Invention

The present invention relates to a connector system that is board mounted so as to be connectable to planar pads provided in an area array on a surface of the circuit board.

2. Description of the Prior Art

Advances in the computational power of integrated circuitry have proceeded to the extent where the perimetrical dimensions of the circuit board on which the integrated circuitry is disposed afford insufficient space for the required number of input/output planar pads. In response board designers have located planar pads for input/output lines on interior regions of the surface of the board. Such an arrangement of planar pads is known in the art as an area array. Interconnection to the planar pads in an area array may be afforded in a variety of ways.

One typical expedient is the use of a surface mounted connector which is individually welded to the planar pads in the area array. However, this arrangement is believed conveniently useful only for an area array of two rows. Extensions of such arrangements to higher densities is made difficult due to solder reflow and/or inspection problems.

Another expedient involves the use of a flexible circuit itself having electrical contact pads formed thereon. The pads are biased into contact with the contact points in the area array by a biasing member (e.g., an elastomeric spring). The spring member is secured to the appropriate area of the board by a suitable support system.

The use of the flexible circuit laminants as the direct to-the-board interconnect element is believed beneficial for a number of reasons. The use of such laminants, due to the imaging process that is used to produce them, allows for a greater degree of interconnect density than is normally achievable with the more standard stamped metal and plastic housing connector systems. The laminants can be designed to assure the electrical integrity of the signal that is being transmitted over the connection. Requirements such as matched impedance and shielding are also readily achievable within printed circuit technology.

Moreover, such laminants are used in TAB (tape automated bonding) technology. Increasing numbers of chips and dies are being terminated to flexible circuit substrates due to the accuracy and increased density that can be achieved using TAB technology. TAB manufacturing also allows for better economic manufacturing processes.

The number of chips and or dies that can be mounted to the flexible circuit is strictly a function of the design of the circuit itself. Chips and dies may be mounted on both sides of the flexible circuit. The circuit itself can be a single layer circuit or a multi-layer circuit. The contact pad pattern can be any design consistent with a user's requirements. The density and design of the pattern of contact pads is only limited by the user's design and by the dimensional tolerances associated with properly locating the pad pattern on the flexible circuit with the pattern of planar pads on the board. The contact pads on the flexible circuit (or the planar pads on the board) may be dimpled, if necessary, in order to take advantage of the concentration of Hertzian stress that such point-to-point contact would produce. The flex circuit design can be customized for each application depending upon what function is required.

In view of the foregoing it is believed advantageous to provide a modularized interconnect system using a flexible circuit as the interconnect element whereby electrical contact with the planar pads in the area array on the surface of a board may be effected.

SUMMARY OF THE INVENTION

The present invention relates to a board mounted connector system for interconnecting the planar pads disposed in an area array on a surface of a board. The connector system includes (a) a modular connector, (b) a frame, and (c) securing means for securing the connector within a predetermined distance of the surface of the board.

The modular connector itself includes a flexible circuit disposed in a generally hollow support cover. The cover preferably has a first open end and a closed second end. A biasing member, preferably in the form of a spring frame having an array of spring biasing elements thereon, is receivable within the support cover. The springs are preferably bowed outwardly and extend a predetermined distance from the open end of all cover. The flexible circuit having a predetermined pattern of contact pads on the exterior surface thereof is folded over spring biasing elements.

The support frame is mountable on and attachable to a surface of the board. The connector is received by the frame and supported within a predetermined close distance of the board surface so that the springs extending from the cover are flexed, thereby to impose a biasing force on the flexible circuit to hold the contact pads on the flexible circuit in biased contact against the planar pads in the area array on the board.

In a first implementation the support frame is disposed on the same side of the board as the planar pads in the area array with which contact is to be effected. In this instance the support frame has a first and a second channel therein. The securing means takes the form of a latching arrangement having a pair of resilient latch arms which extend rearwardly from the spring frame and pass through openings provided in the closed end of the support cover. A latching tab is provided on each latch arm. Each tab extends outwardly from the cover through an aperture formed in the sidewall thereof. The tabs are received into the channels provided in the support frame to lock the modular connector thereto. The support frame thereby holds the connector within a predetermined distance of the surface of the board so that the springs are flexed to impose a biasing force on the flexible circuit. This biasing force urges the pads on the flexible circuit into electrical contact with the planar pads on the board. In the event that both surfaces of the board contain an area array of planar pads, a support frame may also be provided on both the first and second surfaces of the board. Each of the frames may receive a modular connector therein.

In an alternate implementation the support frame is connected to the board on the surface opposite the surface on which the area array of planar pads is disposed. The cover has an attachment arrangement which effects the attachment to the frame. The attachment arrangement takes the form of screw flanges, jack screws, or the like, which pass through openings provided in the circuit board surface and which engage the frame.

In either implementation, some accommodation should be made to permit a wiping action to occur between the contact pads and the planar pads. In the context of the first implementation, this accommodation could include judicious design of the biasing member and/or appropriate sizing of the channels into which the latch arms are received to permit the modular connector to undergo a rolling motion whereby the contact pads can wipe the surface of the planar pads. Further, guide channels may be provided in the frame to assist the insertion of the modularized connector into the channels in the frame. In the second implementation wipe may be achieved by judicious design of the biasing member.

BRIEF DESCRIPTION OF THE DRAWINGS

The invention will be more fully understood from the following detailed description thereof, taken in connection with the accompanying drawings, which form a part of this application and in which:

FIG. 1A illustrates an alternate positioning arrangement for positioning the flexible circuit in accordance with the present invention;

FIG. 3 is a side view, in section, taken along section lines 3—3 of FIG. 2, showing securing means in the form of a latching arrangement whereby the modular connector is locked to the support frame;

DETAILED DESCRIPTION OF THE INVENTION

Figure 1:
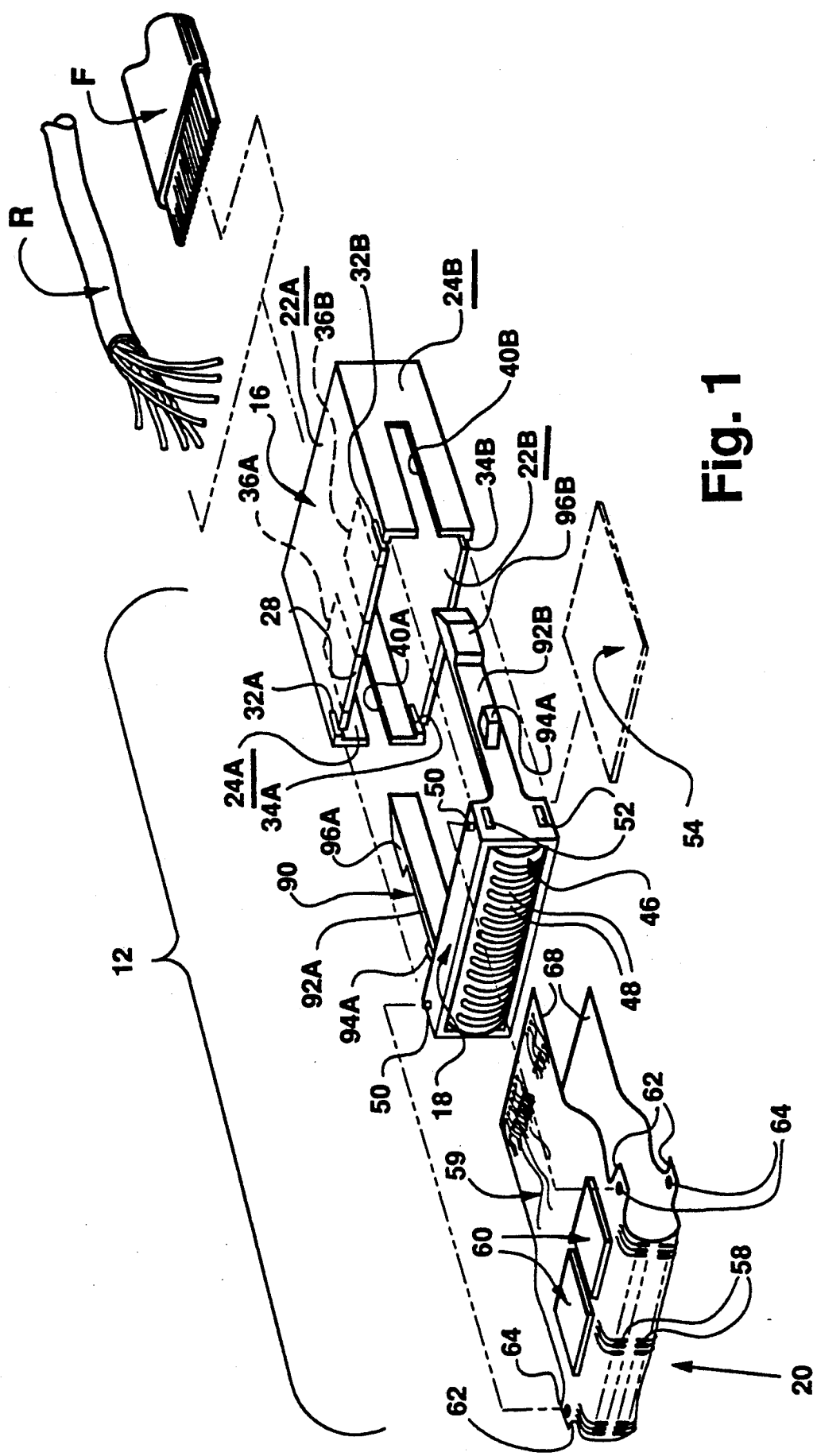
FIG. 1 is an exploded perspective view of the board surface mounted connector system in accordance with the present invention.

Throughout the following detailed description similar reference numerals refer to similar elements in all figures of the drawings.

Figure 2A:
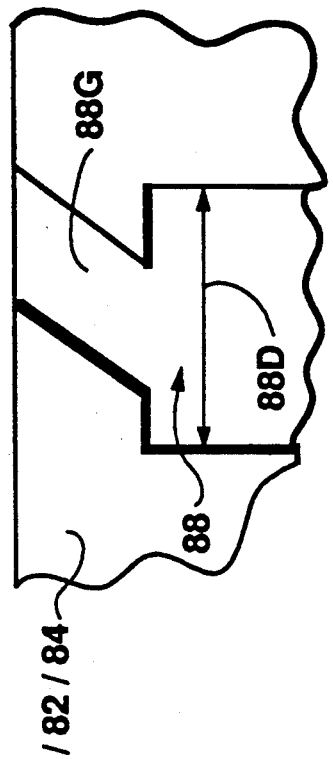
FIG. 2A is an enlarged side elevational view taken along view lines 2A—2A in FIG. 2.
Figure 2:
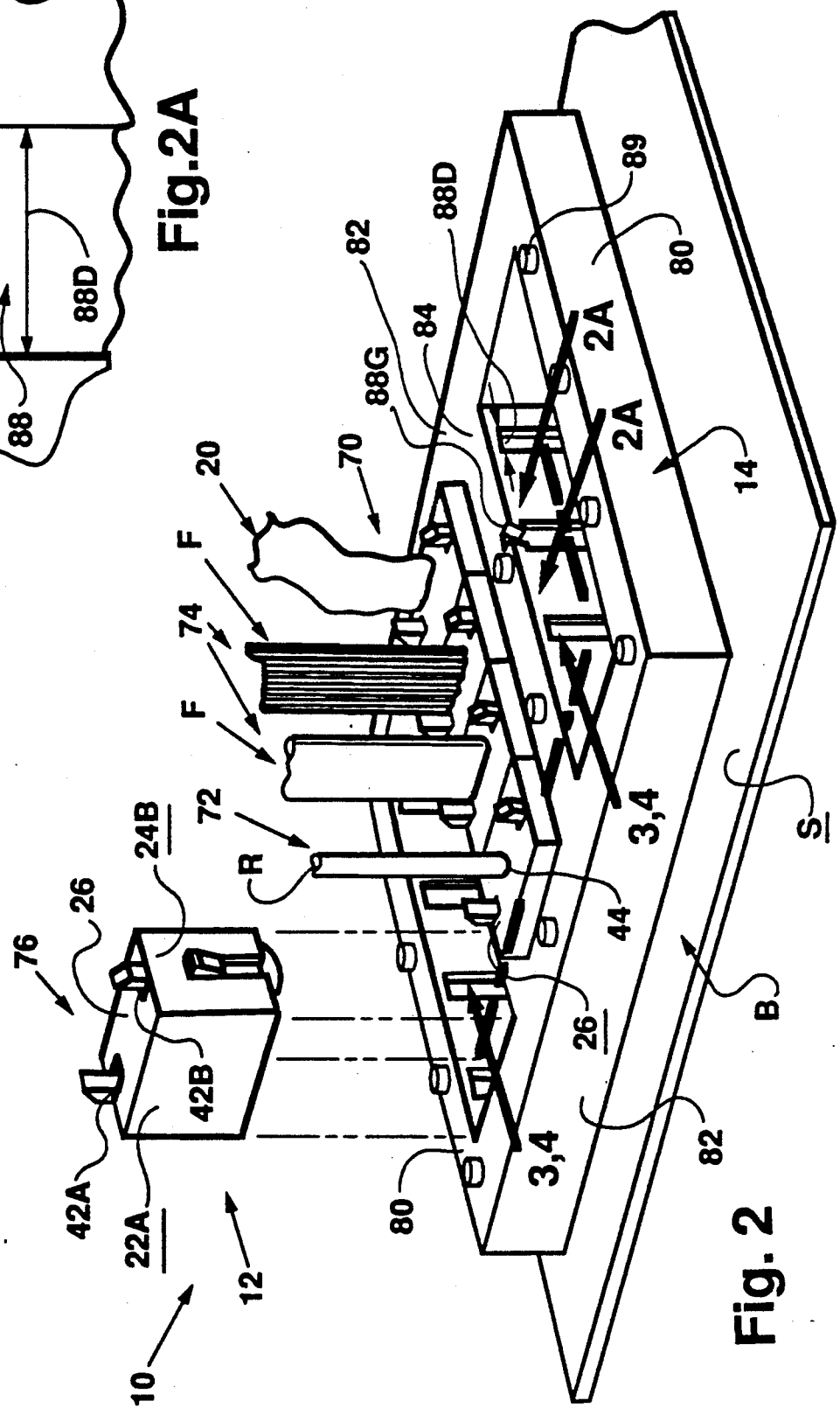
FIG. 2 is a perspective view of the connector system in accordance with the present invention mounted to the surface of a board.

With general reference to FIGS. 1 through 3 shown is a board mounted connector system generally indicated by the reference character 10 (FIGS. 2 and 3) in accordance with the present invention. The connector system 10 is adapted for use with a planar circuit board indicated by the character B, as partially illustrated in FIGS. 2 and 3. As noted and discussed earlier at least a first surface S of the circuit board B has a predetermined number of planar pads C (FIG. 3) generally located in a predetermined defined region on the surface of the board B known as an area array A. The connector system 10 in accordance with the present invention provides an arrangement whereby the planar pads C within an area array A may be electrically connected to any predetermined location. In some instances the electrical connection effected using the connector system 10 may be used to interconnect the planar pads C to predetermined line(s) in a cable (either round or flat). In other instances the planar pads C may be electrically interconnected with integrated circuits which are able to be mounted within the connector system 10 itself, in a manner to be described.

As illustrated in FIGS. 1 and 2 the connector system 10 comprises a modular connector generally indicated by the reference character 12 that is, in use, operatively associated with a support frame 14 (FIGS. 2 and 3). As is best seen in FIG. 1, the modular connector 12 includes a cover 16, a spring frame 18 and a flexible circuit 20.

The cover 16 is, in the preferred instance, a hollow generally rectangular member typically manufactured of a molded thermoplastic material. Of course, other suitable materials may be used. The cover 16 has opposed pairs of major sidewalls 22A, 22B and minor sidewalls 24A, 24B that are closed at one end by a backwall 26 (FIGS. 2 and 3). The opposite end 28 of the cover 16 is open. The major sidewall 22A has a pair of short slots 32A, 32B, while the major sidewall 22B has a corresponding pair of short slots 34A, 34B. If desired, one or more windows 36A, 36B may be provided in one (or both) of the major sidewalls 22A, 22B, for a purpose to be described. In the implementation of the invention shown in FIGS. 1 through 3 each sidewall 24A, 24B has a respective elongated slot 40A, 40B while the backwall 26 is provided with apertures 42A, 42B (FIG. 2). The backwall 26 may also be provided with an access opening 44.

The cover 16 receives the spring frame 18. The spring frame 18 receives a biasing member 46, which in the preferred instance takes the form of a stand of bowed, metallic spring fingers 48. Preferably, the spring frame 18 is fabricated from a molded thermoplastic material while the stand of spring fingers is formed of stamped beryllium/copper or stainless steel. Although the stamped spring fingers is preferred, it should be understood that the biasing member can take the form of any suitable biasing force generating member, such as a pneumatic, hydraulic, elastomeric force generating means. Alternative mechanical expedients that lie within the contemplation of the present invention include a coiled spring or a solid planar spring.

Positioning pins 50 are disposed on the major surfaces of the frame 18 in alignment with the pairs of slots 32A, 32B and 34A, 34B in the cover 16. Shims 52 may be provided on the minor surfaces of the frame 18 to assist in the firm seating of the frame 18 into the cover 16. If desired a transition board 54 may be mounted to the frame 18. The fingers 48, when flexed in a manner to be described, provide the normal force 56 (FIG. 3) necessary to guarantee that secure electrical contact is generated with the planar pads C on the board surface S.

The pads 58 (FIGS. 2 and 3) that are urged by the spring fingers 48 into electrical contact with the planar pads C on the board surface S are themselves carried on the flexible circuit 20. The flexible circuit 20 has a predetermined pattern of conductive tracings 59 thereon is folded over and wrapped about the springs 48 supported by the spring frame 18. The flexible circuit 20 may have thereon a predetermined number of integrated circuit chips 60. The chips 60 may be attached to the flexible circuit 20 using tape automated bonding (TAB) techniques, as discussed. The chips 60 may include any active or passive elements and/or components. If the chips 60 require heat sinks, the same may be placed in the windows 36A, 36B that are formed in the major sidewall 22A of the cover 16.

As seen in FIG. 1, the circuit 20 has peripheral flanges 62 in which locating holes 64 are disposed. The holes 64 are received on the positioning pins 50 when the flexible circuit 20 is wrapped over the spring frame 18. In an alternative arrangement shown in FIG. 1A, the flanges 62 may be relocated in the manner illustrated, in which event the positioning pins 50' may be provided on abutments 51 located on the spring frame 18.

Depending upon application, the flexible circuit 20 may extend from the interior of the cover 16 for termination. In this instance the access openings 44 in the backwall 26 are generally rectangular in shape and one (or both) of the tails 68 of the flexible circuit 20 can exit the cover 16 therethrough. Such an arrangement is illustrated at the reference character 70 in FIG. 2. Alternatively, the flexible circuit 20 may be terminated on the interior of the cover 16. In the instance either a round cable R or a flat cable F extends through a correspondingly configured access opening 44 into the interior of the cover 16. An implementation using a round cable R and one using a flat cable F are respectively illustrated at reference characters 72 and 74 in FIG. 2. The cable, whether round or flat, can contain discrete wire conductors, coaxial conductors, twisted pairs, or any other suitable arrangement, such as fiber optic transmission media. The point to note is that the connection system in accordance with the present invention can be made to accommodate any cable arrangement. In the event the size of the cable is too large to extend through the backwall 26 of the cover 16, some adapter arrangement would probably be required.

The termination of the flexible circuit 20 to the cable can be accomplished in any manner. For example, the conductors of the cable can be soldered, laser welded, thermally compression bonded, thermasonically bonded, mechanically crimped, terminated with connectors, or otherwise mated to the tracings T on the flexible circuit 20.

When the flexible circuit 20 is connected to a cable R or F, as the case may be, the transition board 54 may be necessary. The connection can be made directly to the transition board from the cable and the flexible circuit or the ends of the cable conductors and the flexible circuit can be connectorized and then plugged into the corresponding mating connectors that would be mounted to the transition board. Of course, the transition board may carry additional active or passive components.

It should also be understood that termination of the flexible circuit 20 may not be required. If the components 64 on the circuit 20 permit the same to be used as a memory expansion module, a terminator or a diagnostic test module, for example, no termination may be required. Such a non-terminated implementation is illustrated at the reference character 76 in FIG. 2.

The connector system 10 in accordance with the present invention also includes the support frame 14, best shown in FIGS. 2 and 3. The support frame 14 mounts to a surface of the board B and serves as the mechanism whereby the connector is held within a predetermined distance of the surface S of the board B having the planar pads C thereon so that the springs 48 may be flexed, thereby imposing the biasing force 56 on the flexible circuit 20. In this manner the pads 58 on the flexible circuit 20 are disposed in electrical contact with the planar pads C on the board B. The frame 14 can be fabricated from any suitable material, such as aluminum. Since the frame 14 is attached to the board B, it serves a secondary role as a board stiffener.

The frame 14 can be sized to accommodate any predetermined number of modular connectors 12. The size and configuration of the frame is dependent upon factors such as, among others, the density that the user is seeking to achieve on the board, the routing of the conductive patterns on the board, locational tolerances, and the board space available for frame mounting.

Figure 3A:
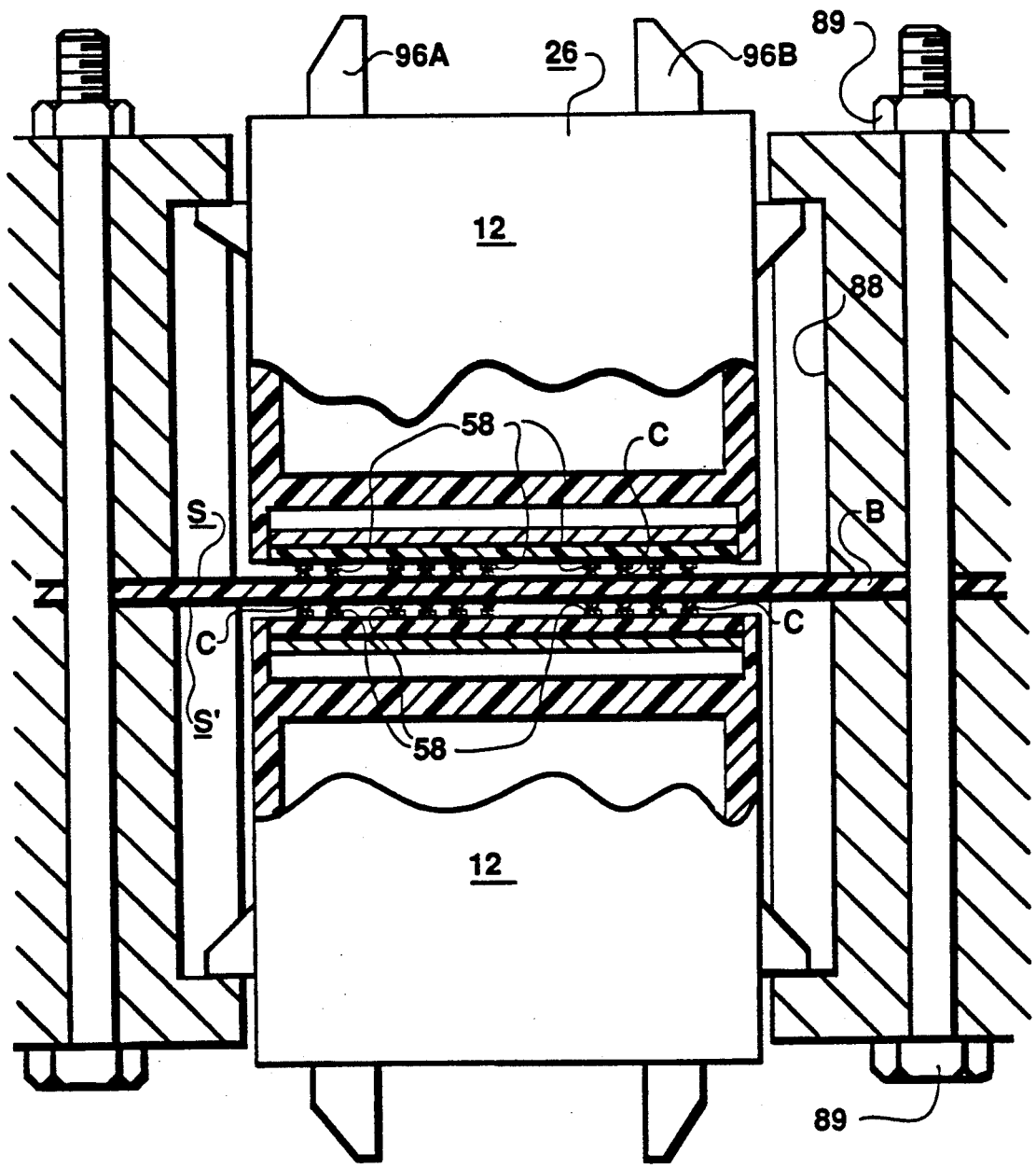
FIG. 3A is a view generally similar to that shown in FIG. 3 in which an arrangement is illustrated whereby a modular connector is locked to a support frame provided on both surfaces of the board.
Figure 4:
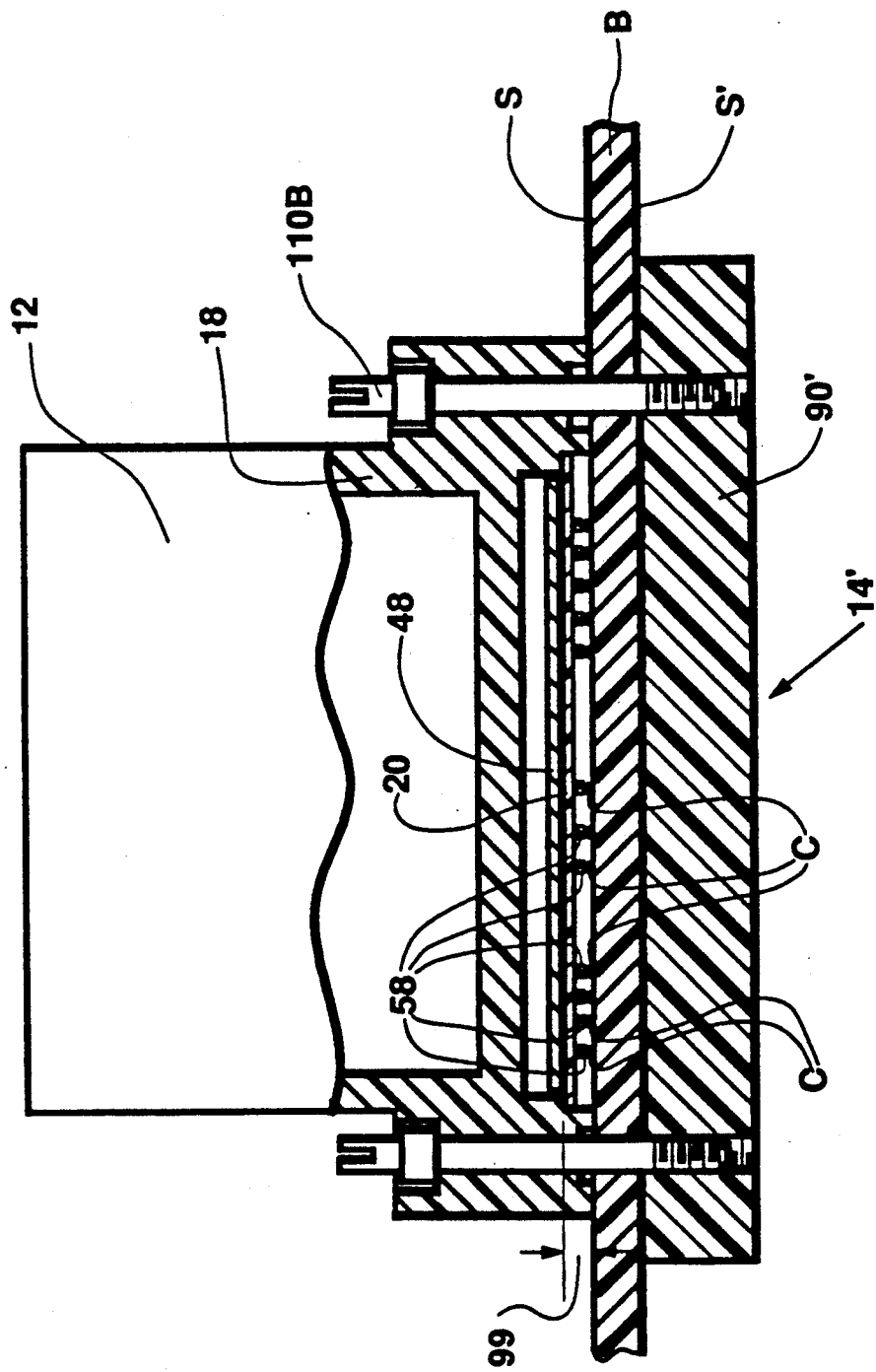
FIG. 4 is a side sectional view, generally similar to FIG. 3, showing an alternate form of securing means for attaching the modular connector to the support frame.

The frame 14 may be mounted to the same surface S of the board B on which are disposed the planar pads C of the area array (FIG. 3) or the frame 14' may be mounted to the opposite surface S' of the board B (FIG. 4). The implementation of FIG. 3, which is preferably used when chip heat sinks are not required, is discussed first.

As seen in FIG. 3 the frame 14 is, in a typical instance for this implementation, a generally rectangular member having sidewalls 80, endwalls 82, and a predetermined number of cross pieces 84 depending upon size of the frame required. The sidewalls, endwalls and cross pieces (if provided) cooperate to define volumes which receive a predetermined number of modular connectors 12. Confronting interior surfaces of the sidewalls 80 endwalls and/or cross pieces 84 contain parallel channels 88. It should be understood that depending upon the particular configuration of the frame used, the sidewalls, endwalls and/or the crosspieces may contain the channels 88. Accordingly, in FIG. 3, the structures that contain the channels 88 are indicated by the combination of reference characters corresponding to these elements. The frame 14 is conveniently attached to the board B using any suitable fastener, such as bolts 89.

To secure the modular connector 12 to the frame 14, an appropriate form of means for securing the modular connector 12 to the frame 14 is provided. In the embodiment of the connector system shown in FIG. 3 the securing means 90 comprises a latching arrangement generally indicated by the reference character 90. The latching arrangement is illustrated in FIGS. 1 through 3.

The latching arrangement includes a first and a second resilient latch arm 92A, 92B trailing rearwardly from the spring support frame 18. A latching tab 94A, 94B is disposed along the exterior surface of each respective latching arm 92A, 92B. The ends of the latching arms 92A, 92B carry respective locking abutments 96A, 96B. In its assembled relationship, the abutments 96A, 96B extend through the apertures 42 in the backwall of the cover 16, with the tabs 94A, 94B projecting sidewise through the respective slots 40A, 40B in which they are received.

Since the tabs 94A, 94B extend past the basic dimension of the cover 16, to insert the modular connector 12 into the frame 14, the abutments 96A, 96B are depressed toward each other (in the direction of the arrows 100, FIG. 3) and the connector 12 introduced into the frame 14. The tabs 94A, 94B are received adjacent to corresponding ones of the channels 88 in the frame. When the pads 58 on the flexible circuit 20 are brought into contact with the planar pads C on the board B, continued further advancement of the connector 12 flexes the springs 48. The reaction of the springs 48 generates the normal force 56 to bias the pads 58 into electrical contact with the planar pads C. When the abutments 96A, 96B are released, the resiliency of the arms moves the tabs 94A, 94B in the direction 102 into the channels 88. Latching surfaces 95A, 95B (FIG. 3) on the respective tabs 94A, 94B abut against the closed ends of the channels 88 to lock the connector 12 in position. The length of the channels 88 are sized such that the connector is locked within a predetermined close distance 99 of the surface S of the board B so that the normal force 56 generated by the reaction of the springs 48 is maintained.

In the event the modification of FIG. 1A is used, the board B is provided with apertures which accept the positioning pins 50', thereby to accurately locate the connector 12 and the contact pads of the flexible circuit therein, over the planar pads on the board.

In the event that the board B is provided with an area array of planar pads on both surfaces S and S' thereof, a frame 14 may be disposed on both board surfaces, as is illustrated in FIG. 3A. In this arrangement, the bolts 89 extend through both frames 14, securing each to the board B.

As seen in FIG. 4 an alternate form of the securing means 90' is used when the frame 14' is disposed on the opposite surface S' of the board B from which the area array of planar pads are disposed. Such an disposition may be necessary, for example, when insufficient space is available on the surface S. As illustrated in FIG. 4 the spring frame 18 has attachment screws 110A, 110B that extend forwardly therefrom. The screws 110A, 110B extend through passages H formed in the board, where they engage the frame 90' (in the form of a bar-like member) attached to the surface S' of the board B. The alternate form of securing means 90' also insures that the connector 12 is locked in position within a predetermined close distance 99 of the surface S of the board B. The normal force 56 generated by the reaction of the springs 48 is thus maintained.

When using any implementation discussed above, some accommodation should be made to permit a wiping action to occur between the contact pads and the planar pads. In the context of the first implementation (FIGS. 3, 3A), this accommodation could include judicious design of the biasing springs such that when flattened to urge the flexible circuit into contact with the board, the flattening of the spring fingers generates the wiping action. Alternatively, the lateral dimension 88D (FIG. 2) of the channels 88 may be such as to permit the modular connector to be inserted at a slight angle with respect to a perpendicular from the board surface, so that the connector may undergo a rolling motion whereby the contact pads can wipe the surface of the planar pads. To facilitate this inclined insertion of the connector inclined guide channels 88G (FIG. 2) may also be provided in the frame 14. The guide channels 88G communicate with the main channel 88 and assist the insertion of the modularized connector into these channels 88 in the frame. In the second implementation wipe may be achieved by judicious design of the biasing member.

Those skilled in the art having the benefit of the teachings of the present invention may effect numerous modifications thereto. It should be understood, however, that such modifications are to be construed as lying within the contemplation of the present invention as defined by the appended claims.

What is claimed:

1. A connector system for use with a planar circuit board having an array of planar pads on at least a first surface thereof, the system comprising:
    (a) a modular connector, the modular connector itself comprising:
        a support cover having a first, open, end;
        a spring frame having a biasing member therein, the frame being receivable by the support cover with the biasing member extending from the open end thereof;
        a flexible circuit having an interior and an exterior surface thereon, the flexible circuit having an array of electrically conductive pads arranged in a predetermined pattern on the exterior surface thereof, the flexible circuit being flexed over the biasing member such that the interior surface of the flexible circuit bears against the biasing member;
    (b) a frame, the frame being mountable on a surface of the circuit board; and
    (c) means for securing the connector within a predetermined distance of the surface of the board having the planar pads thereon so that the springs extending from the cover are flexed, thereby to impose a biasing force on the flexible circuit so that the contact pads on the flexible circuit are disposed in electrical contact with the planar pads on the board.

2. The connector system of claim 1 wherein the board has a second surface thereon, and at least one passage extending therethrough, wherein the frame is disposed on the second surface of the board, the securing means comprising:
    a screw attached to the modular connector, the screw being extendable through the passage in the board into engagement with the frame thereby to lock the connector within the predetermined distance of the first surface of the board to impose the biasing force on the flexible circuit so that the contact pads on the flexible circuit are disposed in electrical contact with the planar pads on the board.

3. The connector system of claim 1 wherein the frame has at least a first and a second close ended channel therein, and wherein the securing means comprises a pair of resilient latch arms having latching tabs thereon extending from the spring frame, the tabs being engageable within the channels thereby to lock the connector within the predetermined distance of the first surface of the board to impose the biasing force on the flexible circuit so that the contact pads on the flexible circuit are disposed in electrical contact with the planar pads on the board.

4. The connector system of claim 1 wherein at least some of the contact pads on the flexible circuit are connected to conductors in a cable, and wherein the support cover has a second end thereon, the second end having an access opening through which the cable extends into the connector.

* * * * *